United States Patent
Hsu et al.

(10) Patent No.: US 11,460,516 B2
(45) Date of Patent: Oct. 4, 2022

(54) FULL LOAD TEST SYSTEM OF ELECTRICAL POWER CONVERTER AND THE TEST METHOD THEREOF

(71) Applicant: Ship and Ocean Industries R&D Center, New Taipei (TW)

(72) Inventors: Hsiao-Yu Hsu, New Taipei (TW); Hung-Hsi Lin, New Taipei (TW); Sheng-Hua Chen, New Taipei (TW)

(73) Assignee: SHIP AND OCEAN INDUSTRIES R&D CENTER, New Taipei (TW)

( * ) Notice: Subject to any disclaimer, the term of this patent is extended or adjusted under 35 U.S.C. 154(b) by 374 days.

(21) Appl. No.: 16/716,440

(22) Filed: Dec. 16, 2019

(65) Prior Publication Data

US 2020/0191879 A1 Jun. 18, 2020

(30) Foreign Application Priority Data

Dec. 14, 2018 (TW) .................. 107145356

(51) Int. Cl.
| | |
|---|---|
| *G01R 31/40* | (2020.01) |
| *G01R 31/42* | (2006.01) |
| *G01R 31/317* | (2006.01) |
| *G01R 31/30* | (2006.01) |
| *G01R 31/34* | (2020.01) |

(Continued)

(52) U.S. Cl.
CPC ......... *G01R 31/42* (2013.01); *G01R 31/3004* (2013.01); *G01R 31/31721* (2013.01); *G01R 31/343* (2013.01); *G01R 31/40* (2013.01); *G01R 31/52* (2020.01); *H02M 3/00* (2013.01); *H02M 7/66* (2013.01)

(58) Field of Classification Search
CPC .... G01R 31/42; G01R 31/40; G01R 19/2513; G01R 31/31721; G01R 31/3004; G01R 31/343; G01R 31/52; H02M 3/00; H02M 7/66
USPC ......... 324/71, 378, 403, 415, 425, 500, 537, 324/764.01
See application file for complete search history.

(56) References Cited

U.S. PATENT DOCUMENTS

2003/0081461 A1* 5/2003 Yamauchi ........... G11C 11/4072
365/189.11
2007/0051165 A1* 3/2007 Maresca, Jr. ............ G01N 1/26
73/40.7

(Continued)

FOREIGN PATENT DOCUMENTS

| CN | 203054099 U | 7/2013 |
|---|---|---|
| JP | H11-299263 A | 10/1999 |

(Continued)

OTHER PUBLICATIONS

JP2004104891 machine translation, Feb. 4, 2004 (Year: 2004).*

*Primary Examiner* — Raul J Rios Russo
(74) *Attorney, Agent, or Firm* — Cheng-Ju Chiang

(57) ABSTRACT

A full load test system of an electrical power converter and the test method thereof is disclosed. The full load test method of the electrical power converter comprises the following steps: (a) providing a power converter under test (PCUT); (b) configuring the PCUT in/on a test circuit; (c) serially connecting the PCUT with at least one bidirectional power converter in the test circuit; (d) connecting the test circuit to an alternating current low voltage three-phase power source; and (e) performing a test of the PCUT under full-load condition.

13 Claims, 5 Drawing Sheets

(51) Int. Cl.
*G01R 31/52* (2020.01)
*H02M 3/00* (2006.01)
*H02M 7/66* (2006.01)

(56) References Cited

U.S. PATENT DOCUMENTS

| | | | |
|---|---|---|---|
| 2011/0068626 A1* | 3/2011 | Terlizzi | H02J 1/14 307/32 |
| 2011/0084553 A1* | 4/2011 | Adest | H02J 7/00 307/63 |
| 2013/0144544 A1* | 6/2013 | Shrivastava | G01R 31/318516 702/58 |
| 2015/0311705 A1* | 10/2015 | Terlizzi | H02J 1/08 307/32 |
| 2018/0196109 A1 | 7/2018 | Zou et al. | |

FOREIGN PATENT DOCUMENTS

| | | |
|---|---|---|
| JP | 2004-104891 A | 4/2004 |
| JP | 2014-90548 A | 5/2014 |
| KR | 10-2015-0061067 A | 6/2015 |

* cited by examiner

FULL LOAD TEST SYSTEM OF ELECTRICAL POWER CONVERTER AND THE TEST METHOD THEREOF

TECHNICAL FIELD

The present invention relates to a full load test of an electrical power converter, and more particularly, to a full load test method for an electrical power converter which greatly reduces the power required for full-load test.

BACKGROUND OF RELATED ARTS

In electrical equipment, the conversion between direct current (DC) and alternating current (AC) has been used for a long time. A power converter with AC-DC conversion function includes a rectifier that can convert AC to DC, an inverter that can convert DC to AC, and even a transformer that can change voltage.

With the development of the technologies, more types and functions of power converters are created, including DC/AC, AC/DC, DC/DC, AC/AC and even AC/DC bidirectional power converters can be achieved. However, in traditional technology, due to the need for testing, when full-load test for power converters is carried out, the power consumption is considerable.

In traditional technology, assuming that the full load power of DC/DC power converter is 250 kW and the full load efficiency is 90%, the full load test power required in traditional technology is 250 kW divided by 90% which power of 278 kW supplied by power source is required to meet the full load test requirement.

In the abovementioned example, it can be easily understood that the known full-load test of power converter has a problem of excessive power required and excessive energy dissipation, which bring great inconvenience to the inspectors in the inspection operation.

SUMMARY

To resolve the drawbacks of the prior arts, the present invention discloses a method of a full load test of a power converter comprising the following steps. First, the step (a) is performed by providing a power converter under test (PCUT).

Then, the step (b) is performed by configuring the PCUT in a test circuit. Next, the step (c) is performed by serially connecting the PCUT with at least one bidirectional power converter in the test circuit. Subsequently, the step (d) is performed by connecting the test circuit to an alternating current (AC) low voltage power source.

In the last, the step (e) is performing a full load test of the PCUT. The above-mentioned method of a full load test of a power converter of the invention proposes a system of a full load test of a power converter comprising an alternating current (AC) low voltage power source, a test circuit, a power converter under test (PCUT) and at least one bidirectional power converter. The test circuit is coupled to the AC low voltage power source, and the power converter under test (PCUT) is configured in the test circuit. The at least one bidirectional power converter is connected in series with the PCUT in the test circuit.

The system and method of a full load test of a power converter of the present invention can greatly reduce the power required for full load test of various power converters to be tested.

Embodiments of the invention are illustrated by way of example, and not by way of limitation, in the figures of the accompanying drawings in which like reference numerals refer to similar elements.

DETAILED DESCRIPTION OF THE INVENTION

In order to understand the technical features and practical efficacy of the present invention and to implement it in accordance with the contents of the specification, hereinafter, preferred embodiments of the present invention will be described in detail with reference to the accompanying drawings.

Figure 1:
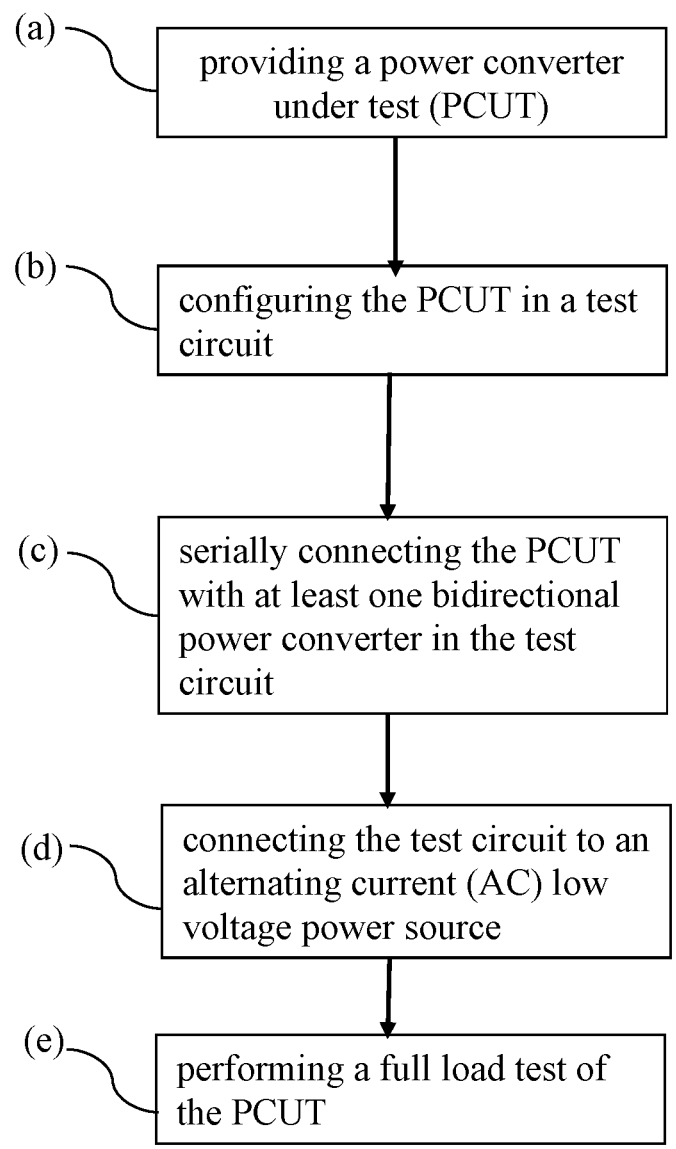
FIG. 1 is a flow chart of a method according to one embodiment of the present invention.

Referring to FIG. 1, it illustrates a flow chart of a method according to one embodiment of the present invention. As shown in FIG. 1, the flow chart of the method of the present embodiment comprises the following steps. Firstly, the step (a) is performed for providing a power converter under test (PCUT). Then, the step (b) is performed for configuring the PCUT in or on a test circuit. Next, the step (c) is performed by serially connecting the PCUT with at least one bidirectional power converter in the test circuit. Subsequently, the step (d) is performed by connecting the test circuit to an alternating current (AC) low voltage power source. Finally, the step (e) is performing a test of the PCUT under full-load condition.

When the process flow in FIG. 1 is applied to various full-load test systems 10 of power converter, the specific embodiments can be illustrated in FIGS. 2-5.

Figure 2:
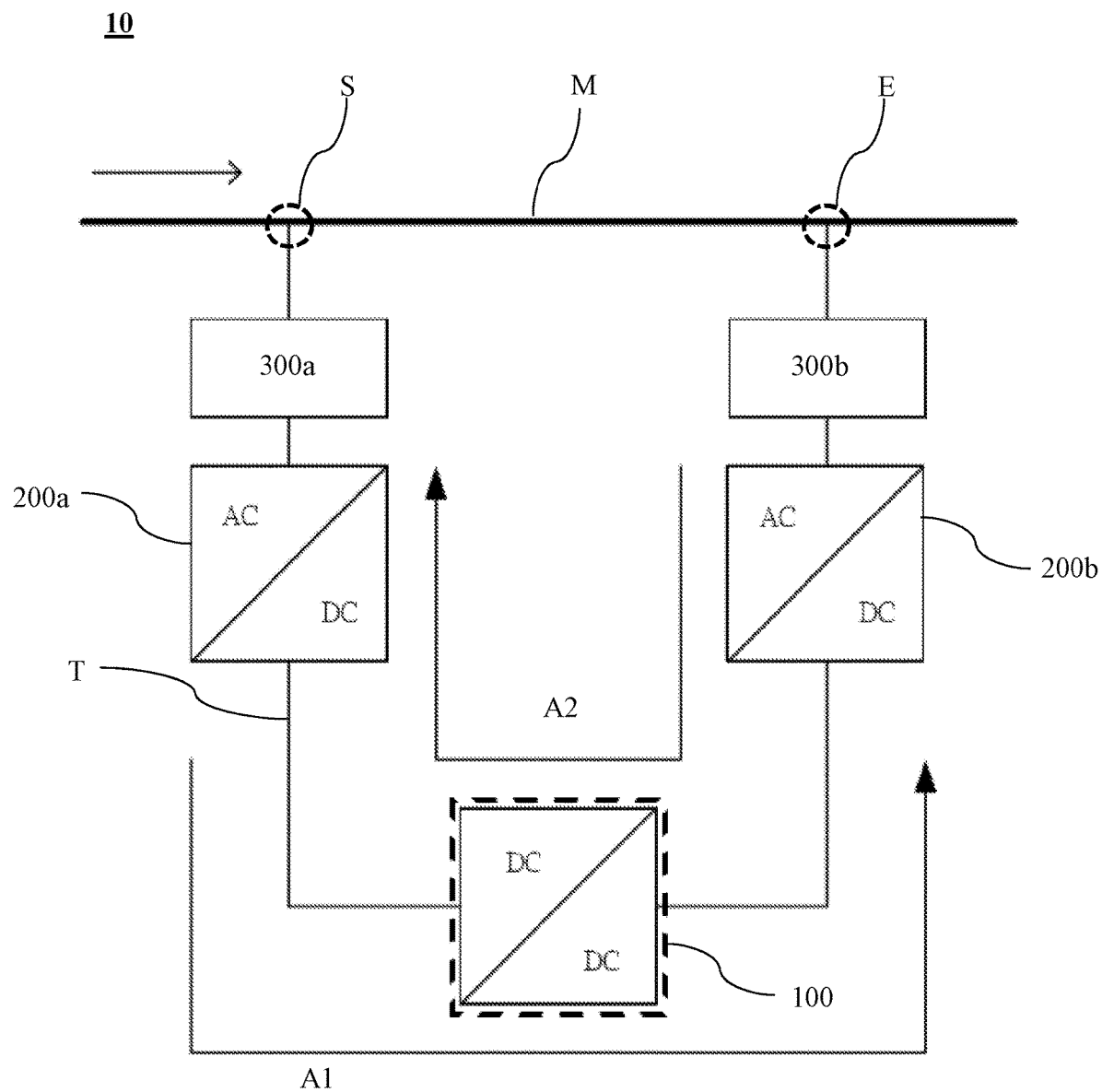
FIG. 2 is a test system architecture diagram according to an embodiment of the present invention.

Referring to FIG. 1 and FIG. 2, FIG. 2 is a test system architecture diagram of an embodiment of the present invention. As shown in FIG. 2, in the architecture of full-load test system of power converter in FIG. 2, an AC low-voltage power source M is an AC three-phase power source with voltage range from 220 volts to 600 volts, while the power converter 100 to be tested is a DC/DC converter. In the embodiment of FIG. 2, the step (a) is first performed to provide the power converter under test (PCUT) 100. Next, the step (b) is executed to configure the PCUT 100 in (on) the test circuit T. In this embodiment, the test circuit T is connected in parallel with the AC low voltage power source M.

The next step (c) is performed by serially connecting the PCUT 100 with at least one bidirectional power converter in the test circuit T. The at least one bidirectional power converter in the present embodiment includes a first bidirectional power converter 200a and a second bidirectional power converter 200b. Therefore, the test circuit T of this embodiment includes, a test start point S, a first filter 300a, the first bidirectional power converter 200a, the PCUT 100, the second bidirectional power converter 200b, a second filter 300b and a test end point E. The test start point S is located on the AC low voltage power source M, and the first filter 300a is electrically connected with the test start point S. The first bidirectional power converter 200a is electrically connected with the first filter 300a, and the PCUT 100 is electrically connected with the first bidirectional power converter 200a.

The second bidirectional power converter 200b is also electrically connected with the PCUT 100, and the second filter 300b is electrically connected with the second bidirectional power converter 200b. The test end point E is located on the AC low voltage power source M, and the test end point E is electrically connected with the second filter 300b. In this embodiment, both of the first filter 300a and the second filter 300b are LCL filters, so that the whole test circuit T can be stably connected in parallel with the AC low voltage power source M.

Then, the step (d) is performed to connect the test circuit T to the AC low-voltage power source M. As mentioned above, in the embodiment of FIG. 2, the whole test circuit T is connected in parallel with the AC low-voltage power source M. Finally, the step (e) is executed to test the PCUT 100 at full load condition.

In the embodiment of FIG. 2, since the PCUT 100 is a bidirectional DC/DC converter in parallel with the AC low voltage power source M, a full load testing can be executed simultaneously along the current direction of arrow A1 and arrow A2. In this embodiment, the power required to test the full-load condition of converting low-voltage (LV) DC to high-voltage (HV) DC is measured in the direction of A1, whereas the power required to test the full-load condition of converting high-voltage (HV) DC to low-voltage (LV) DC is measured in the direction of arrow A2.

However, regardless of the test direction of arrow A1 or A2, the full-load power test in this example assumes that the full-load power of the PCUT 100 is 250 kilowatt (kW) and the full-load efficiency is 90%. Under the premise of 90% bi-directional conversion efficiency, the full load test of the AC low-voltage power source M can be completed only with a power source of $$250 \times \left[ \frac{1}{0.9 \times 0.9} - 0.9 \right] = 83 \text{ kW}.$$

Comparing to the prior art under the same condition, the required power of 278 kW is reduced by 195 kW, and the reduction efficiency of the required power is 70.14%.

Figure 3:
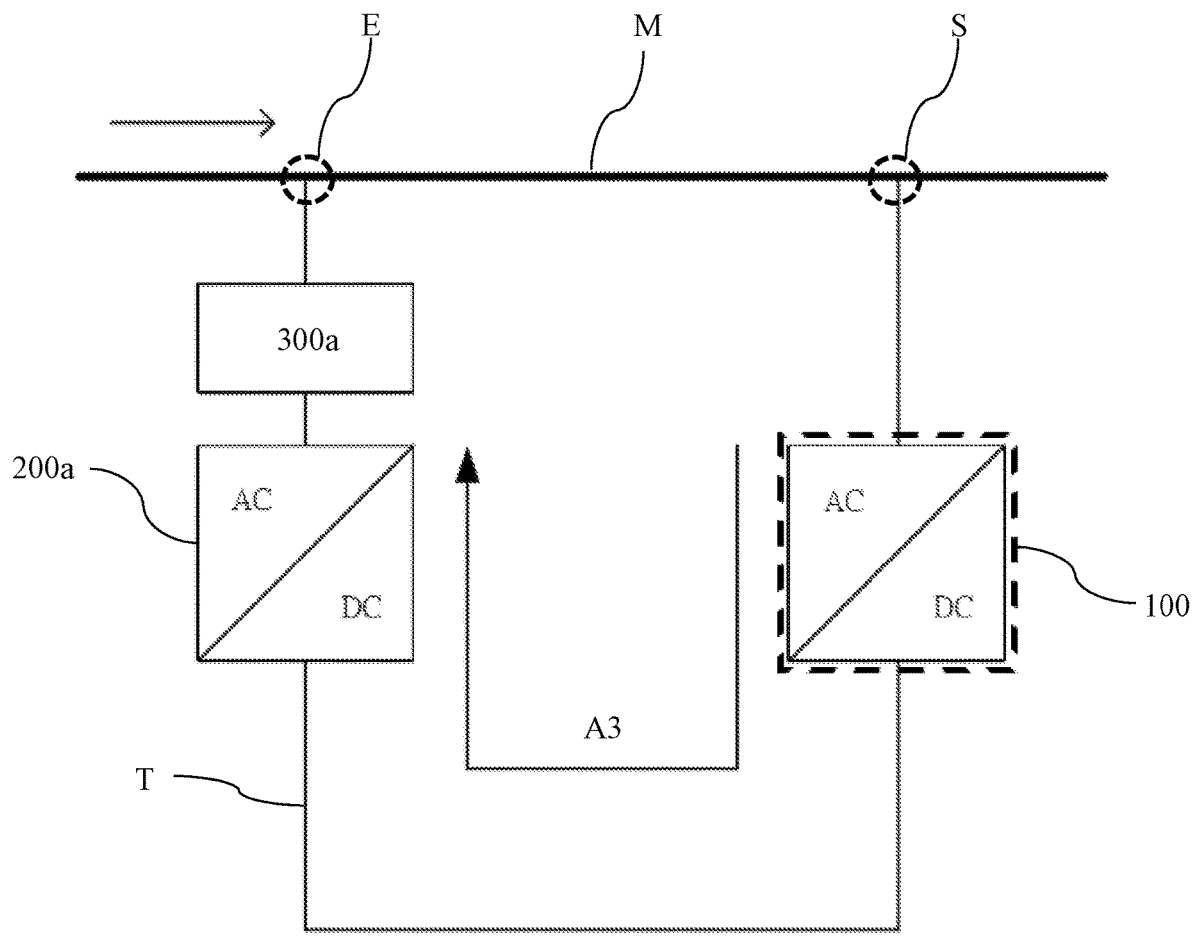
FIG. 3 is a test system architecture diagram according to one embodiment of the present invention.
Figure 4:
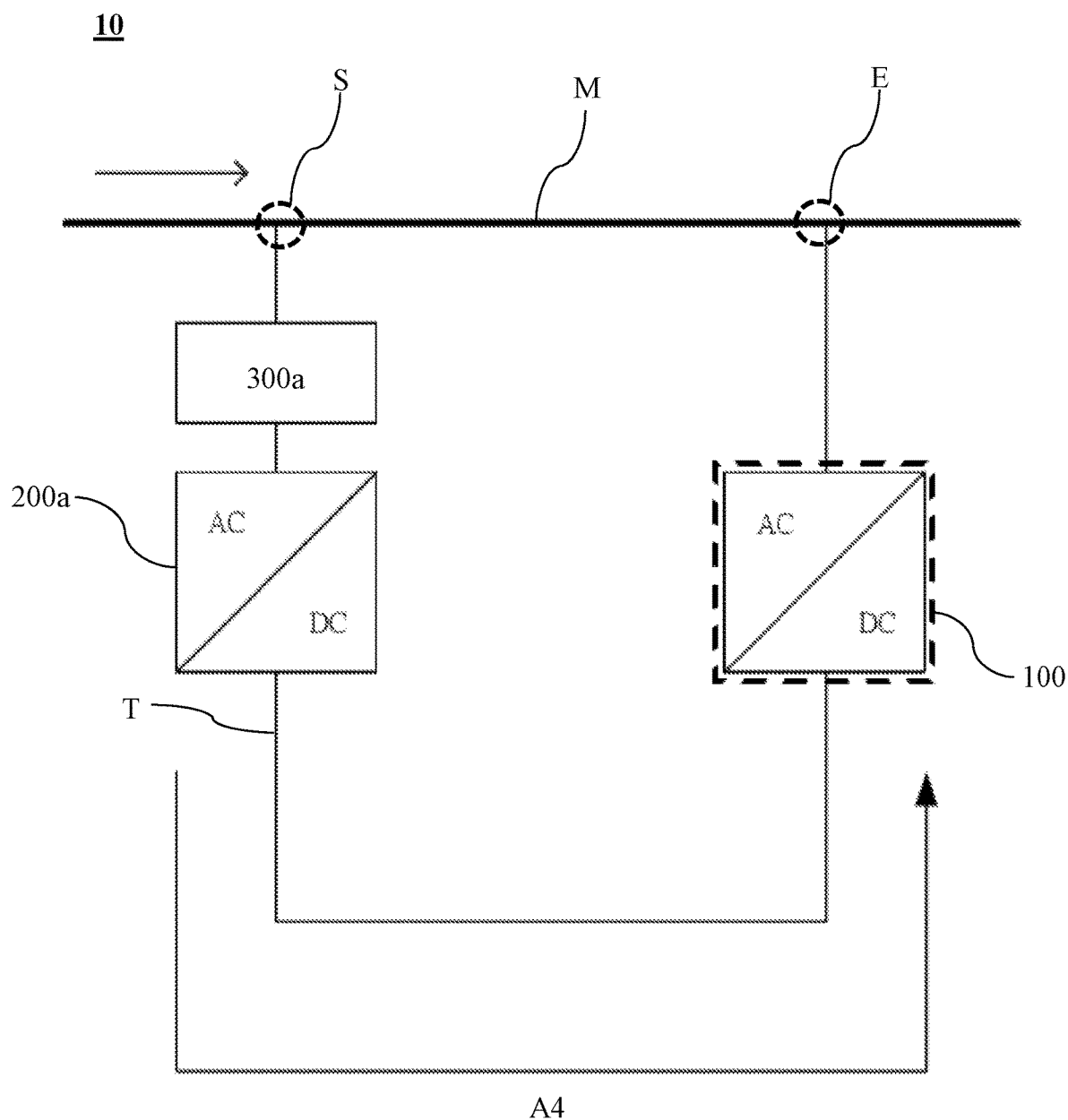
FIG. 4 is a test system architecture diagram according to another embodiment of the present invention.

Please refer to FIG. 1, FIG. 3 and FIG. 4. FIG. 3 is a test system architecture diagram of another embodiment of the present invention, and FIG. 4 is a test system architecture diagram of yet another embodiment of the present invention. In the embodiments of FIG. 3 and FIG. 4, the proposed embodiments are based on the same architecture of the full-load test system 10 of the power converter, which have different conversion efficiency due to different (reverse) current directions. Considering the embodiments of FIG. 1, FIG. 3 and FIG. 4, the step (a) is first performed to provide the power converter under test (PCUT) 100. Next, the step (b) is executed to set the PCUT 100 in the test circuit T. In this embodiment, the test circuit T is also in parallel with the AC low voltage power source M.

The step (c) is performed by serially connecting the PCUT 100 with at least one bidirectional power converter in the test circuit T. At least one bidirectional power converter in the present embodiment includes a first bidirectional power converter 200a. Therefore, the test circuit T of the present embodiment includes a test start point S, a first filter 300a, a first bidirectional power converter 200a, the PCUT 100 and a test end point E. The test start point S is located on the AC low voltage power source M, and the first filter 300a is electrically connected with the test start point S. The first bidirectional power converter 200a is electrically connected with the first filter 300a, and the PCUT 100 is electrically connected with the first bidirectional power converter 200a. The test end point E is located on the AC low voltage power source M, and the test end point E is electrically connected to the PCUT 100. In this embodiment, the first filter 300a is an LCL filter.

Then, the step (d) is performed to connect the test circuit T to the AC low-voltage power source M. As mentioned above, in the embodiment of FIG. 3 or FIG. 4, the whole test circuit T is connected in parallel with the AC low-voltage power source M. Finally, the step (e) is executed to test the PCUT 100 at full load condition.

In the embodiment of FIG. 3 or FIG. 4, since the PCUT 100 is a bidirectional AC/DC converter in parallel with the AC/DC low-voltage power source M, full-load test can be performed along the current direction of arrow A3 (as shown in FIG. 3) and arrow A4 (as shown in FIG. 4).

In these embodiments, the conversion efficiency is 90% in the full load test along the direction of A3 in the embodiment of FIG. 3, and the conversion efficiency is 95% in the direction of arrow A4 in the embodiment of FIG. 4.

However, regardless of the test direction of arrow A3 or A4, under the same condition, the full-load power test in this implementation assumes that the full-load power of the PCUT 100 is 250 kW and the full-load efficiency is 90%. In the embodiment of FIG. 3, since the conversion efficiency of the PCUT 100 is 90%, the full load test of the AC low-voltage power source M can be completed only with a power source of $$250 \times \left[ \frac{1}{0.9} - 0.9 \right] = 53 \text{ kW}.$$

Compared with the prior art under the same condition, the required power of 278 kW is reduced by 225 kW, and the reduction efficiency of the required power is 80.93%.

In the embodiment of FIG. 4, because the conversion efficiency of the PCUT 100 is 95%, the full load test can be completed only with a power source of $$250 \times \left[ \frac{1}{0.9 \times 0.95} - 1 \right] = 42 \text{ kW}.$$

Compared with the prior art under the same condition, the required power of 278 kW is reduced by 236 kW, and the reduction efficiency of the required power is 84.89%.

Figure 5:
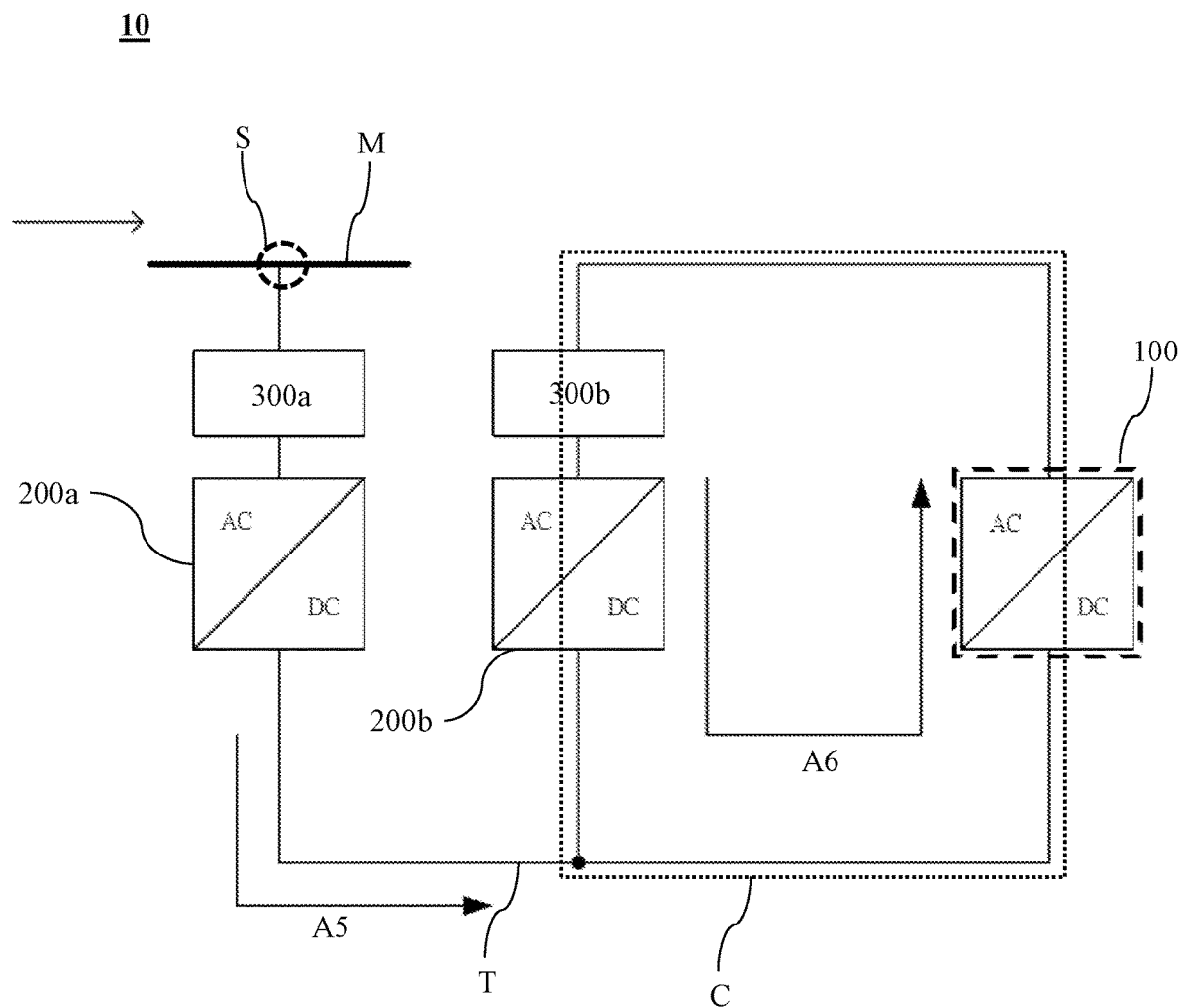
FIG. 5 illustrates a test system architecture diagram according to yet another embodiment of the present invention.

Finally, referring to FIG. 1 and FIG. 5, FIG. 5 is a test system architecture diagram of yet another embodiment of the present invention. As shown in FIG. 5, in the full-load test system 10 for power converter in FIG. 5, the AC low-voltage power source M is an AC three-phase power source with a voltage less than 600 volts. In the embodiment of FIG. 5, the step (a) is first performed to provide the PCUT 100. Next, the step (b) is executed to configure the PCUT in the test circuit T. In this embodiment, the test circuit T is connected to the AC low voltage power source M only through a single test start point.

The step (c) is performed to connect the PCUT 100 in series with at least one bidirectional power converter in the test circuit T. At least one bidirectional power converter in the present embodiment includes a first bidirectional power converter 200a and a second bidirectional power converter 200b. Therefore, the test circuit T of this embodiment includes a test start point S, a first filter 300a, the first bidirectional power converter 200a, a loop circuit C, the PCUT 100, the second bidirectional power converter 200b and a second filter 300b. The test start point S is located on the AC low voltage power source M, and the first filter 300a is electrically connected with the test start point S. The first bidirectional power converter 200a is electrically connected with the first filter 300a, and the loop circuit C is electrically connected with the first bidirectional power converter 200a.

The PCUT 100 and the second bidirectional power converter 200b are also located on the loop circuit C, and the second bidirectional power converter 200b is connected in series with the PCUT 100. The second filter 300b is also electrically connected to the second bidirectional power converter 200b on the loop circuit C. In this embodiment, both the first filter 300a and the second filter 300b are LCL filters, which stabilize the entire test circuit T.

Then, the step (d) is performed to connect the test circuit T to the AC low-voltage power source M. As mentioned above, in the embodiment of FIG. 2, the test circuit T is connected to the AC low voltage power source M through the test start point S. Finally, the step (e) is executed to test the PCUT 100 at full load condition.

In the embodiment of FIG. 5, since the PCUT 100 does not in parallel connection with the A C low voltage power source M and the PCUT 100 is a DC/DC converter, the power supplied by the AC low voltage power source M inputs into the loop circuit C along the direction of arrow A5 and the current circulates in the loop circuit C along the direction of arrow A6 during the full load test.

When the full load power test is performed according to the embodiment of FIG. 5, the full load power of the power converter 100 to be tested is assumed to be 300 kW, and the full load efficiency is 92%. Under the premise of 95% conversion efficiency, the full load test of the AC low-voltage power source M can be completed only with a power source of $$300 \times \left[\frac{1}{0.92 \times 0.95} - 1\right] = 43 \text{ kW}.$$

Compared with the prior art under the same condition, the original required power of 326 kW is greatly reduced by 283 kW, and the reduction efficiency of the required power is 86.81%.

The application of the embodiment of the present invention can greatly reduce the power required for full load test of various power converters 100 to be tested, which can not only solve the energy consumption problem, but also achieve the effect of improving the test efficiency.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

What is claimed is:

1. A method of a full load test of a power converter, comprising:
   (a) providing a power converter under test (PCUT);
   (b) configuring said PCUT in a test circuit;
   (c) serially connecting said PCUT with at least one bidirectional power converter in said test circuit;
   (d) connecting said test circuit to an alternating current (AC) low voltage power source; and
   (e) performing a full load test of said PCUT;
   wherein said PCUT in step (c) is a DC/DC converter, said test circuit is connected in parallel with said AC low-voltage power source and said at least one bidirectional power converter includes a first bidirectional power converter and a second bidirectional power converter, wherein said the test circuit includes a test start point located on said AC low voltage power source, a first filter electrically connected with said test start point, said first bidirectional power converter electrically connected with said first filter, said PCUT electrically connected with said first bidirectional power converter, said second bidirectional power converter connected with said PCUT, a second filter electrically connected with said second bidirectional power converter and a test end point located on said AC low voltage power source to electrically connect with said second filter.

2. The method of claim 1, wherein said AC low-voltage power source is an AC three-phase power source with voltage range from 220 volts to 600 volts.

3. The method of claim 1, wherein said first filter and said second filter are LCL filters.

4. A method of a full load test of a power converter, comprising:
   (a) providing a power converter under test (PCUT);
   (b) configuring said PCUT in a test circuit;
   (c) serially connecting said PCUT with at least one bidirectional power converter in said test circuit;
   (d) connecting said test circuit to an alternating current (AC) low voltage power source; and
   (e) performing a full load test of said PCUT;
   wherein said PCUT in step (c) is an AC/DC converter, said test circuit is connected in parallel with said AC low-voltage power source and said at least one bidirectional power converter includes a first bidirectional power converter, wherein said the test circuit includes a test start point located on said AC low voltage power source, a first filter electrically connected with said test start point, said first bidirectional power converter electrically connected with said first filter, said PCUT electrically connected with said first bidirectional power converter and a test end point located on said AC low voltage power source to electrically connect with said PCUT.

5. The method of claim 4, wherein said first filter is an LCL filter.

6. A method of a full load test of a power converter, comprising:
   (a) providing a power converter under test (PCUT);
   (b) configuring said PCUT in a test circuit;
   (c) serially connecting said PCUT with at least one bidirectional power converter in said test circuit;
   (d) connecting said test circuit to an alternating current (AC) low voltage power source; and
   (e) performing a full load test of said PCUT;

wherein said PCUT in step (c) is an AC/DC converter, said test circuit does not connect in parallel with said AC low-voltage power source and said at least one bidirectional power converter includes a first bidirectional power converter and a second bidirectional power converter, wherein said the test circuit includes a test start point located on said AC low voltage power source, a first filter electrically connected with said test start point, said first bidirectional power converter electrically connected with said first filter, a loop circuit electrically connected with said first bidirectional power converter, said PCUT electrically connected with said loop circuit, said second bidirectional power converter located on said loop circuit to connect in parallel with said PCUT, a second filter located on said loop circuit to electrically connect with said second bidirectional power converter.

7. The method of claim 6, wherein said first filter and said second filter are LCL filters.

8. A system of a full load test of a power converter, comprising:
   an alternating current (AC) low voltage power source;
   a test circuit coupled to said AC low voltage power source;
   a power converter under test (PCUT) configured in said test circuit; and
   at least one bidirectional power converter connected in series with said PCUT in said test circuit;
   wherein said PCUT is a DC/DC converter, said test circuit is connected in parallel with said AC low-voltage power source and said at least one bidirectional power converter includes a first bidirectional power converter and a second bidirectional power converter, wherein said the test circuit includes a test start point located on said AC low voltage power source, a first filter electrically connected with said test start point, said first bidirectional power converter electrically connected with said first filter, said PCUT electrically connected with said first bidirectional power converter, said second bidirectional power converter connected with said PCUT, a second filter electrically connected with said second bidirectional power converter and a test end point located on said AC low voltage power source to electrically connect with said second filter.

9. The system of claim 8, wherein said first filter and said second filter are LCL filters.

10. A system of a full load test of a power converter, comprising:
    an alternating current (AC) low voltage power source;
    a test circuit coupled to said AC low voltage power source;
    a power converter under test (PCUT) configured in said test circuit; and
    at least one bidirectional power converter connected in series with said PCUT in said test circuit;
    wherein said PCUT is an AC/DC converter, said test circuit is connected in parallel with said AC low-voltage power source and said at least one bidirectional power converter includes a first bidirectional power converter, wherein said the test circuit includes a test start point located on said AC low voltage power source, a first filter electrically connected with said test start point, said first bidirectional power converter electrically connected with said first filter, said PCUT electrically connected with said first bidirectional power converter and a test end point located on said AC low voltage power source to electrically connect with said PCUT.

11. The system of claim 10, wherein said first filter is an LCL filter.

12. A system of a full load test of a power converter, comprising:
    an alternating current (AC) low voltage power source;
    a test circuit coupled to said AC low voltage power source;
    a power converter under test (PCUT) configured in said test circuit; and
    at least one bidirectional power converter connected in series with said PCUT in said test circuit;
    wherein said PCUT is an AC/DC converter, said test circuit does not connect in parallel with said AC low-voltage power source and said at least one bidirectional power converter includes a first bidirectional power converter and a second bidirectional power converter, wherein said the test circuit includes a test start point located on said AC low voltage power source, a first filter electrically connected with said test start point, said first bidirectional power converter electrically connected with said first filter, a loop circuit electrically connected with said first bidirectional power converter, said PCUT electrically connected with said loop circuit, said second bidirectional power converter located on said loop circuit to connect in parallel with said PCUT, a second filter located on said loop circuit to electrically connect with said second bidirectional power converter.

13. The system of claim 12, wherein said first filter and said second filter are LCL filters.

* * * * *